United States Patent
Johnson et al.

(10) Patent No.: US 9,026,414 B2
(45) Date of Patent: May 5, 2015

(54) SYSTEMS AND METHODS FOR DETERMINING SPEED CONTROL MANAGEMENT SETTINGS

(75) Inventors: Erik S. Johnson, Snoqualmie, WA (US); Richard Hampson, Redmond, WA (US); Zachary Slaton, Seattle, WA (US)

(73) Assignee: PACCAR Inc, Bellevue, WA (US)

( * ) Notice: Subject to any disclaimer, the term of this patent is extended or adjusted under 35 U.S.C. 154(b) by 563 days.

(21) Appl. No.: 13/312,892

(22) Filed: Dec. 6, 2011

(65) Prior Publication Data

US 2013/0144581 A1    Jun. 6, 2013

Related U.S. Application Data

(60) Provisional application No. 61/566,556, filed on Dec. 2, 2011.

(51) Int. Cl.
| | |
|---|---|
| *G06F 17/00* | (2006.01) |
| *F16H 59/52* | (2006.01) |
| *F16H 61/02* | (2006.01) |
| *B60W 30/184* | (2012.01) |

(52) U.S. Cl.
CPC ....... *F16H 61/0213* (2013.01); *B60W 30/1843* (2013.01); *B60W 30/184* (2013.01); *F16H 2061/022* (2013.01); *F16H 2061/0223* (2013.01)

(58) Field of Classification Search
CPC .......... B60W 30/184; B60W 30/1843; B60W 30/1846; B60W 30/186; B60W 30/188; B60W 30/1884; B60W 30/1882
See application file for complete search history.

(56) References Cited

U.S. PATENT DOCUMENTS

| | | | |
|---|---|---|---|
| 4,492,112 A | 1/1985 | Igarashi |
| 4,555,691 A | 11/1985 | Hosaka |
| 4,631,515 A | 12/1986 | Blee |
| 4,853,673 A | 8/1989 | Kido |
| 5,017,916 A | 5/1991 | Londt |
| 5,393,277 A | 2/1995 | White |
| 5,477,452 A | 12/1995 | Milunas |
| 5,564,999 A | 10/1996 | Bellinger |
| 5,884,210 A | 3/1999 | Rettig |

(Continued)

OTHER PUBLICATIONS

Belludi et al., Cummins Vehicle Mission Simulation Tool: Software Architecture and Applications, SAE International, 2010.*

(Continued)

*Primary Examiner* — Aniss Chad
*Assistant Examiner* — Michael P Healey
(74) *Attorney, Agent, or Firm* — Christensen O'Connor Johnson Kindness PLLC

(57) ABSTRACT

Methods and devices for determining speed control management settings are provided. A vehicle configuration is obtained, specifying at least a transmission, including a number of gears present in the transmission. One or more speed control management modules, such as progressive shift and/or gear down protection modules, are selected by a customer. One or more default progressive shift limits and a default gear down protection limit are calculated, along with gears for which they are active. Performance of the vehicle using the default speed control management settings is simulated and compared to typical vehicle performance. The customer may alter the speed control management settings within dynamically determined valid ranges. The speed control management settings are used in the manufacture or other configuration of the vehicle for the customer.

12 Claims, 11 Drawing Sheets

(56) References Cited

U.S. PATENT DOCUMENTS

| | | | |
|---|---|---|---|
| 5,954,617 | A | 9/1999 | Horgan |
| 6,092,021 | A | 7/2000 | Ehlbeck |
| 6,577,938 | B1 | 6/2003 | Bellinger |
| 6,957,139 | B2 | 10/2005 | Bellinger |
| 7,447,584 | B2 | 11/2008 | McMullen |
| 2009/0036267 | A1* | 2/2009 | Bellinger ............ 477/97 |
| 2010/0305798 | A1 | 12/2010 | Phillips |

OTHER PUBLICATIONS

Mitra et al., Driveline Optimisation of a Heavy Duty Truck, SAE Technical Paper 2007-01-3698, 2007.*

Progressive Shift, Revision 1.1, Navistar Engine Group, 2009.*

International Search Report and Written Opinion mailed Nov. 14, 2012, issued in corresponding International Application No. PCT/US2011/063603, filed Dec. 6, 2011, 7 pages.

"1996 Seagrave Triple," Product Information Sheet, 2005, Los Angeles Fire Department, <http://lafdtraining.org/ists/logbook/96seagraveda.pdf> [retrieved Aug. 17, 2011], 27 pages.

"Gear Down Protection (GDP)," Product Information Sheet, Navistar Engine Group, © 2009 Navistar, Inc., <http://evalue.internationaldelivers.com/service/bodybuilder/general/engine_feature/documents/Gear_Down_Protection_Load_Based_14.pdf> [retrieved Aug. 17, 2011], 12 pages.

"Gear-Down Protection," © 2010 Cummins, Inc., <http://cumminsengines.com/sites/every/misc/geardown.page> [retrieved Aug. 17, 2011], 1 page.

Kalenski, N., "Ford Gear-Shift Indicator Helps Fuel Economy," Automobiles Review, <http://www.automobilesreview.com/auto-news/ford-gear-shift-indicator-helps-fuel-economy/8003/> [retrieved Aug. 17, 2011], 3 pages.

Lockwood, R., "On-Board Speed Manager," Heavy Duty Trucking 83(2), <http://www.truckinginfo.com/hdt/archives/2004/02/052a0402.asp> [retrieved Aug. 17, 2011], Feb. 2004, 8 pages.

"Programming Cat® Electronic Truck Engines—May 2005," © 2005 Caterpillar, <http://www.motor-talk.de/forum/aktion/Attachment.html?attachmentld=435123> [retrieved Aug. 17, 2011], 184 pages.

"Progressive Shift," Product Information, 7SA825 0403, © 2004 Detroit Diesel Corporation, <http://www.ddcsn.com/cps/rde/xbcr/ddcsn/14_progressive_shift.pdf> [retrieved Aug. 17, 2011], pp. 5-64-5-65.

* cited by examiner

Fig.10.

2-SPEED PROGRESSIVE SHIFT (PGS) ENGINE SPEED LIMIT INPUTS

What is the first gear in which you would like progressive shift active? 2

What is the first engine speed limit when progressive shift is active? 1400 Acceptable range: 1400-1800 rpm What is the highest gear in which you would like the first progressive shift limit applied? 4

What is the second engine speed limit when progressive shift is active? 1450 Acceptable range: 1400-1800 rpm and > first engine speed limit What is the highest gear in which you would like the second progressive shift applied? 8

[ Save ]

Fig.11.

GEAR DOWN PROTECTION INPUT

What is the first gear in which you would like gear down protection active? 9

What engine speed limit would you like when gear down protection is active? 1600 Acceptable range: 1300-1900 rpm What is the last gear in which you would like gear down protection active? 9

[ Save ]

SYSTEMS AND METHODS FOR DETERMINING SPEED CONTROL MANAGEMENT SETTINGS

CROSS-REFERENCE TO RELATED APPLICATION

This application claims the benefit of Provisional Application No. 61/566,556, filed Dec. 2, 2011, which is incorporated herein by reference in its entirety for all purposes.

BACKGROUND

Increasing demands are being placed on finite energy reserves used to power vehicles such as cars, trucks, and the like. In this regard, improvements to make vehicles and drivers more efficient provide benefits of minimizing transportation costs and reducing environmental pollutants. Current technologies for improving driver efficiency include progressive shifting (PGS) and gear down protection (GDP). PGS prompts a driver to switch to a higher gear when a PGS engine speed setpoint is reached to encourage early shifting. GDP prompts a driver to switch to a higher gear when a GDP engine speed setpoint is reached to encourage operating in a higher gear. In either situation, drivers may be prompted directly by displaying a visual indicator, or indirectly by automatically reducing an amount of fuel made available to the engine.

Unfortunately, PGS setpoint engine speeds and GDP setpoint engine speeds are currently determined by trial and error. This is a problem, especially considering that the high degree of customizability available when ordering a vehicle (e.g., engine models, transmission models and configuration, and/or the like) makes it unlikely that setpoints appropriate for one vehicle configuration will be appropriate for another vehicle configuration or that setpoints appropriate for one intended use will be appropriate for another intended use.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments of the present disclosure are directed to systems and methods for automatically determining optimal setpoints for both progressive shift and gear down protection, such that a configured vehicle may be operated efficiently and reliably at all speeds.

In some embodiments, a computer-implemented method of configuring a vehicle is provided. A computing device receives a vehicle configuration. The computing device determines at least one progressive shift limit or at least one gear down protection shift limit based on the vehicle configuration, and stores in an order data store the determined at least one progressive shift limit or the determined at least one gear down protection shift limit.

In some embodiments, a nontransitory computer-readable medium having computer executable instructions stored thereon is provided. The instructions, if executed by one or more processors of a computing device, cause the computing device to perform actions for configuring a vehicle. The actions comprise receiving a vehicle configuration; determining a progressive shift limit and a gear down protection limit associated with the vehicle; determining whether the progressive shift limit and the gear down protection limit result in any dead gears based on the vehicle configuration; and, in response to determining that the limits result in a dead gear, modifying the progressive shift limit or the gear down protection limit to eliminate the dead gear; and storing the modified progressive shift limit or the modified gear down protection limit.

In some embodiments, a computing device comprising at least one processor, a memory, and a computer-readable medium having computer-executable instructions stored thereon is provided. In response to execution by the at least one processor, the computer-executable instructions cause the computing device to provide components for configuring a vehicle, the components comprising a setting calculation component and a vehicle simulation component. The setting calculation component is configured to obtain a vehicle configuration, the vehicle configuration including at least a set of typical shift points, and calculate one or more speed control management settings based on the vehicle configuration. The vehicle simulation component is configured to obtain a set of vehicle drive cycles, determine a typical simulated performance for each vehicle drive cycle in the set of vehicle drive cycles based on the vehicle configuration and the set of typical shift points, determine a speed control management simulated performance for each vehicle drive cycle in the set of vehicle drive cycles based on the vehicle configuration and the speed control management settings, and present at least one comparison of the typical simulated performance and the speed control management simulated performance to a customer.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 10 illustrates an exemplary interface dialog for displaying progressive shift setting ranges and accepting a selection from a customer according to various aspects of the present disclosure; and FIG. 11 illustrates an exemplary interface dialog for displaying gear down protection setting ranges and accepting a selection from the customer according to various aspects of the present disclosure.

DETAILED DESCRIPTION

Figure 1:
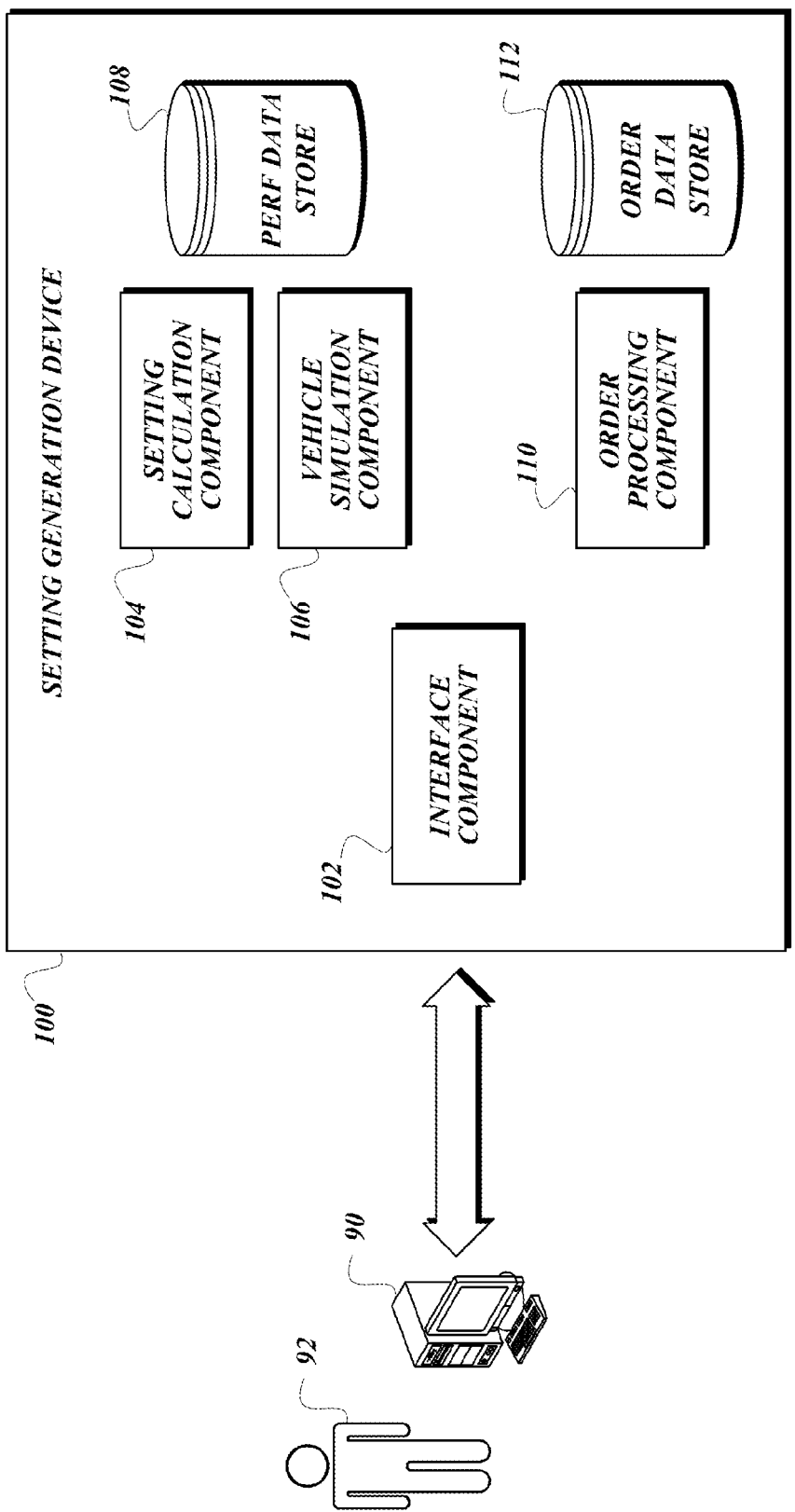
FIG. 1 illustrates one embodiment of a system for assisting a customer to configure one or more speed control management setpoints according to various aspects of the present disclosure.

The present disclosure relates to systems and methods that automatically calculate appropriate settings for progressive shift and gear down protection control strategies based on a typical operating condition, a powertrain optimization goal, and/or a specific vehicle configuration. After appropriate default settings are generated, the customer is provided an opportunity to modify the settings within dynamically determined bounds, and the modified settings are automatically checked to ensure that they would result in acceptable driveability.

In various embodiments of the present disclosure, a vehicle configuration is received by a system wherein the vehicle configuration includes information such as a gross combined weight, an aerodynamic profile, a selected engine model, a transmission configuration (including number of gears and gear ratios), a rear axle ratio, an application (such as long-haul delivery, local delivery, and/or the like), a tire size, and/or the like. Truck operating conditions are also received as part of the vehicle configuration, and may include an optimization goal (such as performance, fuel economy, and/or the like), a typical operating speed, typical shift points for each gear, and/or the like. In some embodiments, the system may present options to a user (such as whether to calculate progressive shift settings and/or whether to calculate gear down protection settings) based on the received information.

Assuming that the user has selected to enable a progressive shift module and a gear down protection module, embodiments of the present disclosure may generate default progressive shift and gear down protection settings (including engine speed limit setpoints and/or transmission gears for which a given setpoint is applied) based on one or more of the following: characteristics of the selected engine model (such as a torque map and/or the like), characteristics of the selected transmission (such as the number of gears and the gear ratios), the rear axle ratio, the tire size, the optimization goal, and the typical cruise speed. In several embodiments, the system may then calculate bounds within which the determined progressive shift and gear down protection settings may be altered while still maintaining adequate performance based on the associated vehicle characteristics, and may allow the customer to change the settings within those bounds.

In some embodiments, more than one progressive shift limit may be calculated. For example, in a transmission with a small number of gears (e.g., 9, 10, or 13 gears, compared to 18 gears) the difference between gear ratios may be much greater for lower gears than for higher gears. In such a case, a lower progressive shift limit may be calculated for a set of lower gears, and a higher progressive shift limit may be calculated for a set of higher gears.

Some configurations could lead to unusable gears. For example, if a progressive shift setting recommends a shift into a higher gear for which gear down protection is active, yet switching into that gear would cause the gear down protection limit to be exceeded, the higher gear would not be usable. In some embodiments of the present disclosure, such unusable gears are detected and avoided when calculating the settings.

In some embodiments, the disclosed systems may display various metrics to help a customer reach a decision concerning where to place the final settings. For example, the system may display graphs showing performance of the default settings for sample drive cycles with respect to fuel economy and drive cycle time, and may also display graphs of one or more custom settings for comparison.

FIG. 1 illustrates one embodiment of a system for assisting a customer to configure one or more speed control management settings. A customer 92 uses a client computing device 90 to connect to a setting generation device 100. The client computing device 90 may be any type of computing device capable of connecting to the setting generation device 100 and capable of presenting an interface to the customer 92. In the illustrated embodiment, the client computing device 90 is a desktop computer that includes one or more processors, a memory, computer-readable storage media, a display device, one or more input devices, and a network interface. In another embodiment, the client computing device 90 is some other type of computing device having a display, at least one processor, and a memory. Examples of other types of computing devices include a laptop computer, a tablet computer, a mobile device, a point-of-sale system, and the like. The client computing device 90 may connect to the setting generation device 100 via a standard web browser, through a terminal client, through a stand-alone program, and/or the like.

In the illustrated embodiment, the customer 92 uses the client computing device 90 directly to access the setting generation device 100. However, in another embodiment, the customer 92 may use an agent, such as a vehicle salesperson in a showroom or at a call center, to operate the client computing device 90. Such changes and others in how the customer 92 provides the information to the setting generation device 100 are within the scope of the appended claims.

The setting generation device 100 may be any type of computing device configurable to execute the components described below and to communicate with the client computing device 90. In one embodiment, the setting generation device 100 is a server computer having one or more processors, a memory, computer-readable storage media, and a network interface. In another embodiment, the setting generation device 100 is a different type of computer, such as a laptop computer, a desktop computer, and/or the like. In yet another embodiment, the components of the setting generation device 100 may be executed on more than one computing device, or may be executed by the client computing device 90.

The setpoint configuration device 100 includes components such as an interface component 102, a setting calculation component 104, a vehicle simulation component 106, and an order processing component 110. The interface component 102 is configured to communicate with the other components of the setpoint configuration device 100. The interface component 102 is also configured to present an interface rendered by the client computing device 90 to the customer 92 to allow the customer 92 to configure one or more settings. The setting calculation component 104 is configured to calculate one or more suitable speed control management settings (including at least engine speed limit setpoints and gears for which the setpoints are active) based on at least vehicle configuration information and a vehicle optimization goal. The vehicle simulation component 106 is configured to simulate one or more drive cycles for the configured vehicle, based at least on the vehicle configuration information, the vehicle optimization goal, and the speed control management settings determined by the setting calculation component 104. After settings are chosen by the customer 92, the order processing component 110 may add the selected settings to an order to be fulfilled by an order fulfillment pipeline (not pictured).

In some embodiments, each of the "components" discussed above as parts of the setting generation device 100 include a computing device or a portion of a computing device specially programmed with computer-executable instructions that, if executed by the computing device, cause the computing device to perform the actions associated with the component as discussed below. In some embodiments, each of the "components" may include computer-executable instructions stored on a computer-readable medium, wherein, if executed by one or more processors of a computing device, cause the computing device to perform the actions associated with the component as discussed below.

In some embodiments, the functionality of components depicted as being separate may be performed by a single component, and in other embodiments, the functionality of a component depicted as a single component may be split between multiple components. Components of the setting generation device 100 may be described as presenting information. In the illustrated embodiments, presenting information is shown in the context of a point-and-click computer interface display. Other forms of presentation, such as transmitting information to another computing device to create such a display, presenting information in a different type of interface, and/or the like, are within the scope of the appended claims.

The setting generation device 100 also includes a performance data store 108 and an order data store 112. The performance data store 108 may include detailed information concerning the performance characteristics of the powertrain components that are part of the vehicle configuration. In some embodiments, the performance data store 108 may include a plurality of look-up tables regarding the performance characteristics of various combinations of vehicle components, and may also include optimal setpoint values for such combinations of vehicle components. Possible contents of such look-up tables are described further below. In some embodiments, the performance data store 108 may include data identifying the individual performance characteristics of powertrain components, from which other components of the setting generation device 100 may simulate the performance of the vehicle with one or more computed setpoints. The order data store 112 is configured to store order information, such as information identifying vehicle component configurations, optimization goals selected by the customer 92, any acknowledgement submitted by the customer 92 to ignore the optimization goals, one or more selections made by the customer 92 relating to speed control management settings, and/or the like. Such information may be used during order fulfillment and subsequent performance troubleshooting.

In some embodiments, each of the data stores includes a database that stores the described data in a structured format and is hosted by the setting generation device 100. In some embodiments, each of the data stores include databases that reside on a computing device separate from the setting generation device 100, and are accessed by the components via a network. One of ordinary skill in the art will recognize that, in other embodiments, the data described as being stored in these data stores may be stored by any suitable type of device.

In some embodiments, the order data store 112 may store vehicle configuration information and optimization goal information generated and stored by a powertrain configuration device, by a method such as one of the methods described in commonly owned, co-pending U.S. patent application Ser. No. 13/010,638, filed Jan. 20, 2011, which is incorporated herein by reference in its entirety for all purposes. In some embodiments, the functionality of the setting generation device 100 described herein may be included in the powertrain configuration device. In some embodiments, the setting generation device 100 may be separate from the powertrain configuration device, and may communicate via order information stored in the order data store 112. In some embodiments, the setting generation device 100 and a separate powertrain configuration device may share a common interface component 102, which then communicates with separate components within the setting generation device 100 and the powertrain configuration device. One of ordinary skill in the art will recognize that, in other embodiments, the powertrain configuration device and the setting generation device 100 may be combined in ways not explicitly described herein without departing from the scope of the present disclosure.

Figure 2:
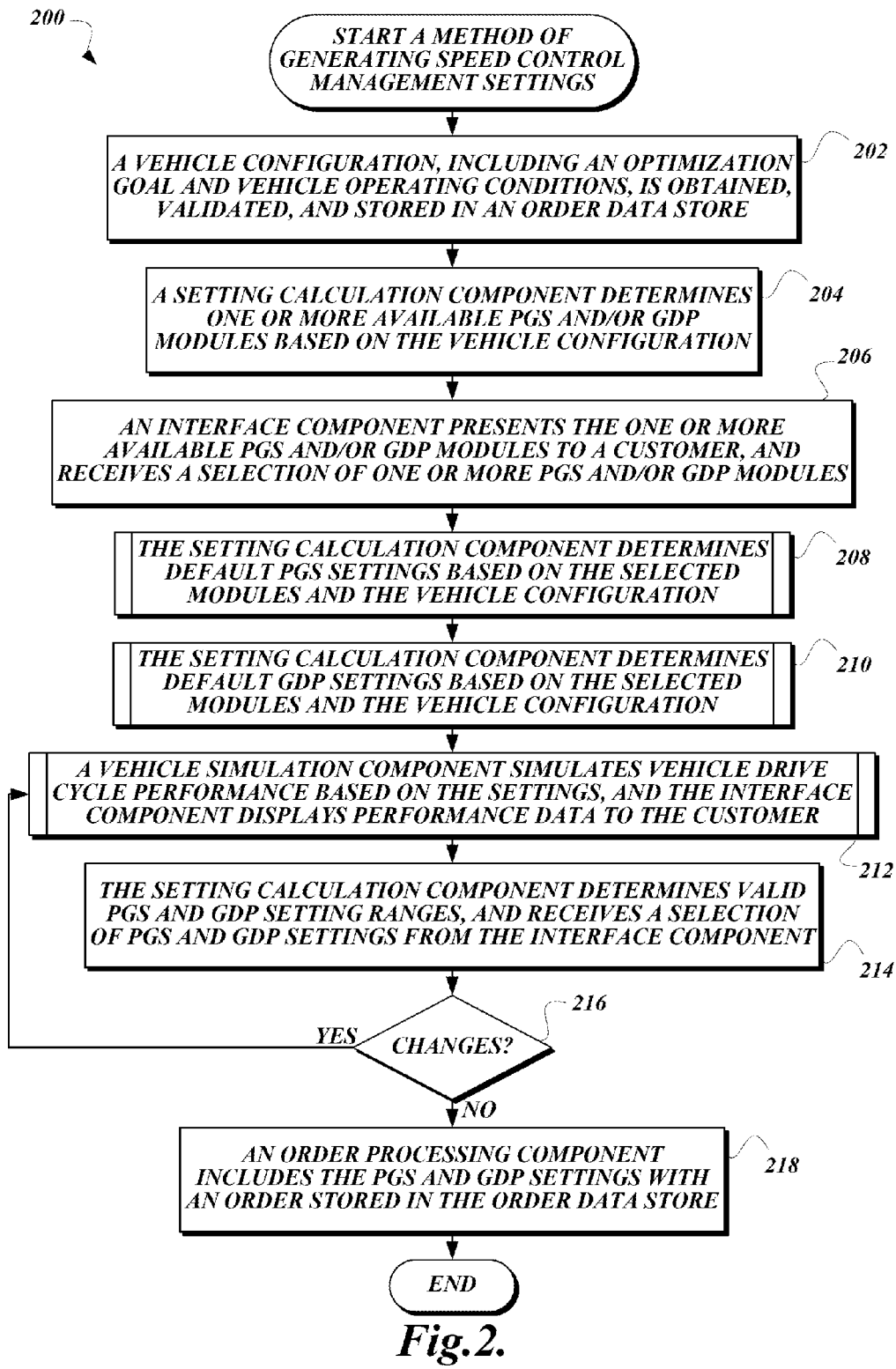
FIG. 2 illustrates one embodiment of a method of generating speed control management settings according to various aspects of the present disclosure.

FIG. 2 illustrates one embodiment of a method 200 of generating speed control management settings according to various aspects of the present disclosure. From a start block, the method 200 proceeds to block 202, where a vehicle configuration, including an optimization goal and one or more vehicle operating conditions, is obtained, validated, and stored in an order data store. As discussed above, the vehicle configuration may be obtained using a method disclosed in co-pending U.S. patent application Ser. No. 13/010,638, or by any other suitable method.

Next, at block 204, a setting calculation component 104 determines one or more available progressive shift (PGS) and/or gear down protection (GDP) modules based on the vehicle configuration. For example, for vehicles with certain transmissions (such as transmissions having 9, 10, or 18 speeds), the change in gear ratio in consecutive gears may be substantially similar throughout the gears. In comparison, vehicles with other transmissions (such transmissions having 13 speeds), the gear ratios in a lower range of gears may change significantly more between consecutive gears than the gear ratios in a higher range of gears. Accordingly, the setting calculation component 104 may only make a progressive shift module available that provides a single progressive shift setpoint for the first type of transmissions, while another progressive shift module may be made available for the second type of transmission that provides two or more progressive shift setpoints to provide a more consistent operator experience across all gears. In some embodiments, the progressive shift setpoints may provide a progressively increasing engine speed limit as the vehicle speed increases.

Figure 3:
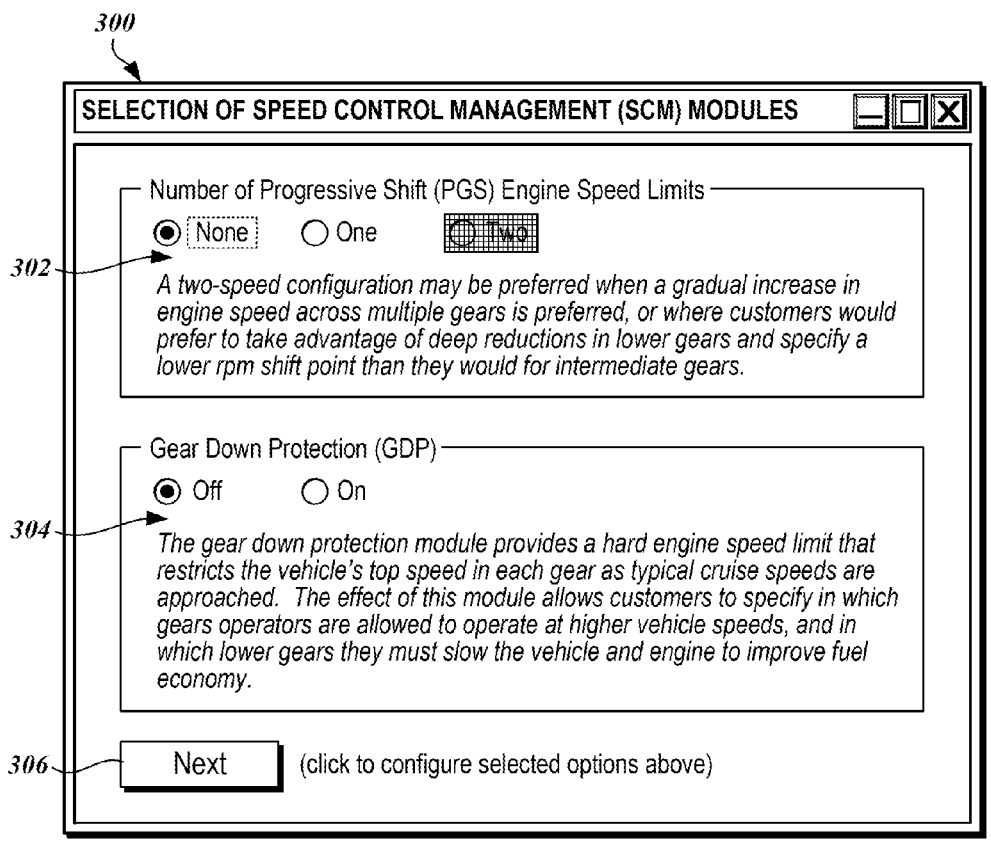
FIG. 3 illustrates one embodiment of an interface dialog presented by an interface component for choosing speed control management modules according to various aspects of the present disclosure.

The method 200 proceeds to block 206, where an interface component 102 presents the one or more available progressive shift and/or gear down protection modules to a customer 92, and receives a selection of one or more progressive shift and/or gear down protection modules. FIG. 3 illustrates one embodiment of an interface dialog 300 presented by the interface component 102 for choosing speed control management modules, according to various aspects of the present disclosure. The interface dialog 300 includes a progressive shift module section 302 and a gear down protection module section 304. The progressive shift module section 302 includes selections for no modules, a module with a single setpoint, and a module with two setpoints. As illustrated, selection of the module with two setpoints has been disabled. As discussed above, the interface component 102 may disable selection of the module with two setpoints in cases where a transmission has a consistent change in gear ratios across its entire operating range, or for other reasons. In some embodiments, the interface component 102 may allow selection of any of the progressive shift modules regardless of the number of transmission gears included in the vehicle configuration.

Figure 4A:
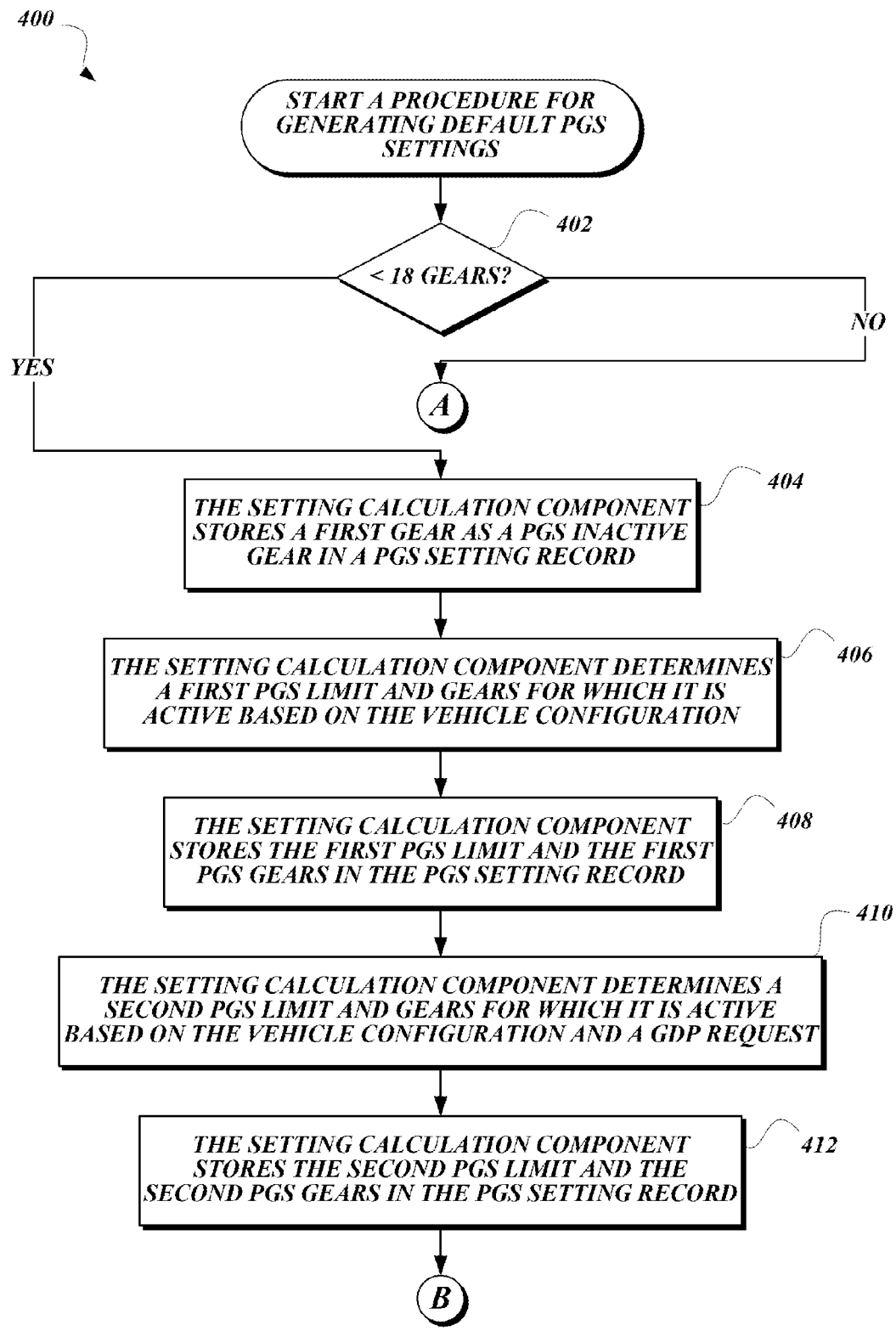
FIGS. 4A-4B illustrate one embodiment of a procedure for generating default progressive shift settings according to various aspects of the present disclosure.
Figure 4B:
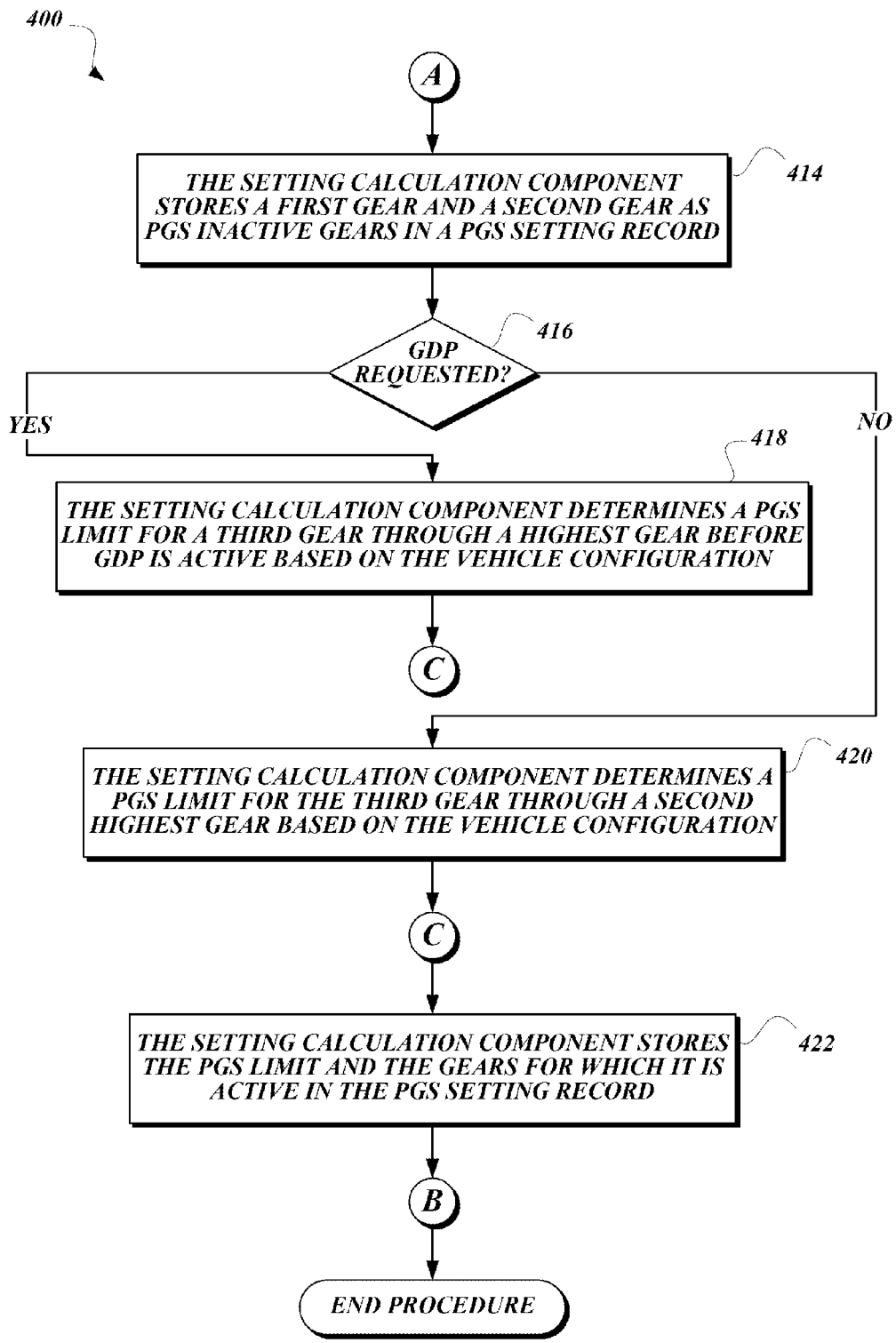

Returning now to FIG. 2, at block 208, a procedure is performed wherein the setting calculation component 104 determines default progressive shift settings based on the selected modules and the vehicle configuration. FIGS. 4A-4B illustrate one embodiment of a procedure 400 carried out at block 208 for generating default progressive shift settings according to various aspects of the present disclosure. From a start block, the procedure 400 proceeds to a decision block 402 where a determination is made as to whether the vehicle configuration includes a transmission having less than a predetermined number of gears, such as eighteen gears. If the answer to the determination at decision block 402 is YES, the procedure 400 proceeds to block 404. At this point, the procedure 400 has determined that the transmission specified by the vehicle configuration includes a number of gears less than the predetermined number of gears, such as nine, ten, or thirteen gears. At block 404, the setting calculation component 104 stores a first (lowest) gear as a progressive shift inactive gear in a progressive shift setting record. The progressive shift setting record temporarily stores the progressive shift settings during processing, and may be stored in volatile memory, in the order data store 112, or in any other suitable storage location. In several transmission types, including transmissions having nine, ten, and thirteen speeds, the first gear is generally adequate for starting movement of the vehicle. The first gear is stored as an inactive gear for progressive shift to allow the operator to use higher engine speeds in the first gear to provide adequate power for starting movement of the vehicle.

Next, at block 406, the setting calculation component 104 determines a first progressive shift limit and gears for which it is active based on the vehicle configuration. In some embodiments, the setting calculation component 104 may consult a look-up table stored in the performance data store 108 to find the appropriate settings based on the optimization goal, the selected engine, the selected transmission, the selected rear-axle ratio, and/or other vehicle configuration settings. In some embodiments, the setting calculation component 104 may retrieve a peak torque range for the selected engine and gear ratios for each transmission gear from the performance data store 108, and may calculate appropriate settings for the optimization goal without using a look-up table. In some embodiments, the progressive shift limit will be set such that the engine operates above a minimum engine speed for peak torque when making an upshift, including in cases where skip shifting is used. The progressive shift limit may also be set such that the engine is allowed to reach a speed at which peak horsepower is obtained. In some embodiments, a typical minimum engine speed for peak torque may be around 1150 RPM, and a typical engine speed for peak horsepower may be around 1600 RPM, but these values may vary depending on the engine design. The first progressive shift limit gears may start at the second gear (since the first gear was previously determined to be inactive), and may include all gears up until a point where the gear speed ratios are reduced due to a transition from a low transmission range to a high transmission range. As one example, in a 13-speed transmission, gear speed ratios between each gear between first gear and sixth gear may be about 1.3 to 1.4; and gear speed ratios between each gear between sixth gear and thirteenth gear may be about 1.17. At block 408, the setting calculation component 104 stores the first progressive shift limit and the first progressive shift gears in the progressive shift settings record.

Next, at block 410, the setting calculation component 104 determines a second progressive shift limit and gears for which it is active based on the vehicle configuration and a gear down protection request. The second progressive shift limit is determined similarly to the first progressive shift limit. That is, the setting calculation component 104 may retrieve the second progressive shift limit from a look-up table based on the vehicle configuration and the optimization goal, or may calculate the second progressive shift limit based on the performance of the components identified in the vehicle configuration. In some embodiments, the first progressive shift limit may be lower to account for the higher reduction of the transmission gears in the low transmission range, and the second progressive shift limit may be higher to allow the engine to remain in the peak torque range despite the lower reduction of the transmission gears in the high transmission range.

In some embodiments, the second progressive shift gears may start at the first gear above the first progressive shift gears. In some embodiments, the second progressive shift gears may extend to a gear depending on whether a gear down protection module has been selected. If gear down protection is enabled, the second progressive shift gears may extend to the highest gear for which gear down protection is not enabled, such that no gear will have both gear down protection and progressive shift enabled at once. If gear down protection is not enabled, the second progressive shift gears may extend to the second highest transmission gear available. Next, at block 412, the setting calculation component 104 stores the second progressive shift limit and the second progressive shift gears in the progressive shift setting record. The procedure 400 then proceeds to a continuation terminal ("terminal B").

If the procedure 400 has determined that the transmission specified in the vehicle configuration has the preselected number of gears or more, such as eighteen gears, the answer to the determination at decision block 402 is NO, and the procedure 400 proceeds to a continuation terminal ("terminal A"). From terminal A (FIG. 4B), the procedure 400 proceeds to block 414, where the setting calculation component 104 stores a first (lowest) gear and a second (second-lowest) gear as progressive shift inactive gears in a progressive shift setting record. The first and second gears may both be specified as inactive gears in an eighteen speed transmission because the tighter differences between gear ratios may make it appropriate for an operator to use the first gear, the second gear, or both when starting movement of the vehicle. In some embodiments, these lower gears may also be used for creeping the vehicle along at low speeds, such as in cases where application requirements may lead to higher engine speeds for maintaining a low creep speed.

Next, at decision block 416, a determination is made as to whether a gear down protection module has been selected. If the answer to the determination at decision block 416 is YES, the procedure 400 proceeds to block 418, where the setting calculation component 104 determines a progressive shift limit for a third gear through a highest gear before gear down protection is active. Similar to the calculations discussed above, the progressive shift limit is based on at least the vehicle configuration, including the optimization goal, and may be calculated or retrieved from a look-up table. The procedure 400 then proceeds to a continuation terminal ("terminal C"). If the answer to the determination at decision block 416 is NO, the procedure 400 proceeds to block 420, where the setting calculation component 104 determines a progressive shift limit for a third gear through a second highest gear (seventeenth gear). As discussed above, the progressive shift limit is based on at least the vehicle configuration, including the optimization goal, and may be calculated or retrieved from a look-up table. The procedure 400 then proceeds to a continuation terminal ("terminal C").

From terminal C, the procedure 400 proceeds to block 422, where the setting calculation component 104 stores the progressive shift limit and the gears for which it is active (either third gear through highest gear before gear down protection is active, or third gear through seventeenth gear) in the progressive shift setting record. The procedure 400 then proceeds to terminal B, and then to an end block where it terminates.

Figure 5:
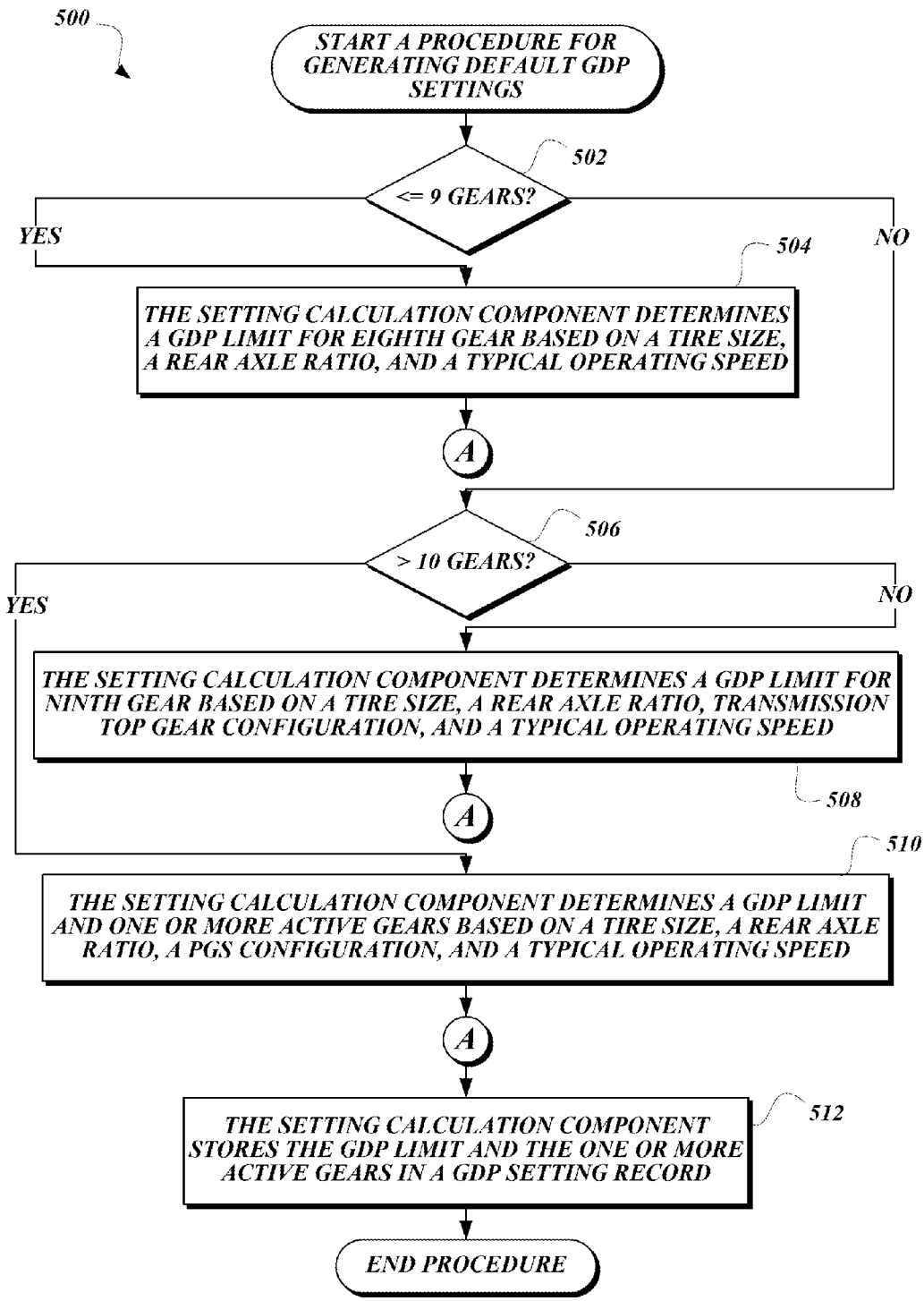
FIG. 5 illustrates one embodiment of a procedure for generating default gear down protection settings according to various aspects of the present disclosure.

Returning now to FIG. 2, at block 210, a procedure is performed wherein the setting calculation component 104 determines default gear down protection settings based on the selected modules and the vehicle configuration. FIG. 5 illustrates one embodiment of a procedure 500, carried out at block 210, for generating default gear down protection settings according to various aspects of the present disclosure. One goal of the gear down protection setting is to encourage the vehicle operator to switch to a higher, more efficient gear to reach a typical operating speed. In some embodiments, the gear down protection setting may impose a hard engine speed limit, such that the vehicle operator may not be able to achieve top speed in any but the highest gear. Accordingly, the gear down protection limit may be calculated such that the limit is reached four to five miles per hour slower than the typical top operating speed of the vehicle. In the illustrated embodiment, different determinations are performed if the specified transmission includes, for example, nine or less gears, ten gears, or more than ten gears (such as thirteen or eighteen gears).

From a start block, the procedure 500 proceeds to a decision block 502, where a determination is made as to whether the transmission specified in the vehicle configuration includes nine or less gears. If the answer to the determination at decision block 502 is YES (in other words, if the specified transmission has nine or less gears), the procedure 500 proceeds to block 504, where the setting calculation component 104 determines a gear down protection limit for eighth gear based on at least a tire size, a rear axle ratio, and a typical operating speed. In some embodiments, the gear down protection limit may be based on other factors as well, such as an auxiliary transmission configuration.

For vehicles having transmissions with nine or less gears, gear down protection may typically be active in eighth gear. As with the progressive shift limits, the gear down protection limit may be retrieved from a look-up table corresponding to the selected transmission and engine, or may be calculated by the setting calculation component 104 based on performance information for each of the selected components. The procedure 500 then proceeds to a continuation terminal ("terminal A").

If the answer to the determination at decision block 502 is NO (in other words, the specified transmission has more than nine gears), the procedure 500 proceeds to another decision block 506, where a determination is made as to whether the transmission specified in the vehicle configuration includes greater than ten gears. If the answer to the determination at decision block 506 is NO (in other words, if the specified transmission has ten gears), the procedure 500 proceeds to block 508, where the setting calculation component 104 determines a gear down protection limit for ninth gear based on at least a tire size, a rear axle ratio, a determination whether the transmission provides direct drive or overdrive in a highest gear, and a typical operating speed. In this embodiment, gear down protection will typically be active in ninth gear. As with the progressive shift limits, the gear down protection limit may be retrieved from a look-up table, or may be calculated by the setting calculation component 104. The procedure 500 then proceeds to a continuation terminal ("terminal A").

If the answer to the determination at decision block 506 is YES (in other words, the specified transmission has more than ten gears, such as thirteen or eighteen gears), the procedure 500 proceeds to block 510, where the setting calculation component 104 determines a gear down protection limit and one or more active gears based on at least a tire size, a rear axle ratio, a progressive shift configuration, and a typical operating speed. As discussed above, the gear down protection limit may be retrieved from a look-up table, or may be calculated based on the performance of the components specified in the vehicle configuration.

In some embodiments, gear down protection will be applied in either one or two gears below a top gear, as opposed to lower gears, at least because a hard engine speed limit applied after reaching the gear down protection limit would be undesirably imposing on the vehicle operator. Two or more gears may be used instead of one gear if the typical operating speed can be reached at 2000 RPM or less in gears that are two gears down or more from the top gear. Otherwise, only the second highest gear may be used. The setting calculation component 104 may make this determination regardless of the number of transmission gears, but in the illustrated embodiment, the determination is associated with thirteen and eighteen speed transmissions because it is more likely that top speed will be reachable in a gear two gears down from top gear in these transmissions. In some embodiments, the setting calculation component 104 may ensure that the combination of the progressive shift setting and the gear down protection setting does not result in an unusable gear. Again, in the illustrated embodiment this is shown as a part of the processing of a transmission with thirteen or eighteen gears, but in other embodiments, this check may be performed with any type of transmission.

The procedure 500 then proceeds to a continuation terminal ("terminal A"), and then to block 512, where the setting calculation component 104 stores the gear down protection limit and the one or more gears for which gear down protection is active in a gear down protection setting record. As with the progressive shift setting record, the gear down protection setting record may be stored in volatile memory, in the order data store 112, or in any other suitable location. The procedure 500 then proceeds to an end block and terminates.

Figure 6:
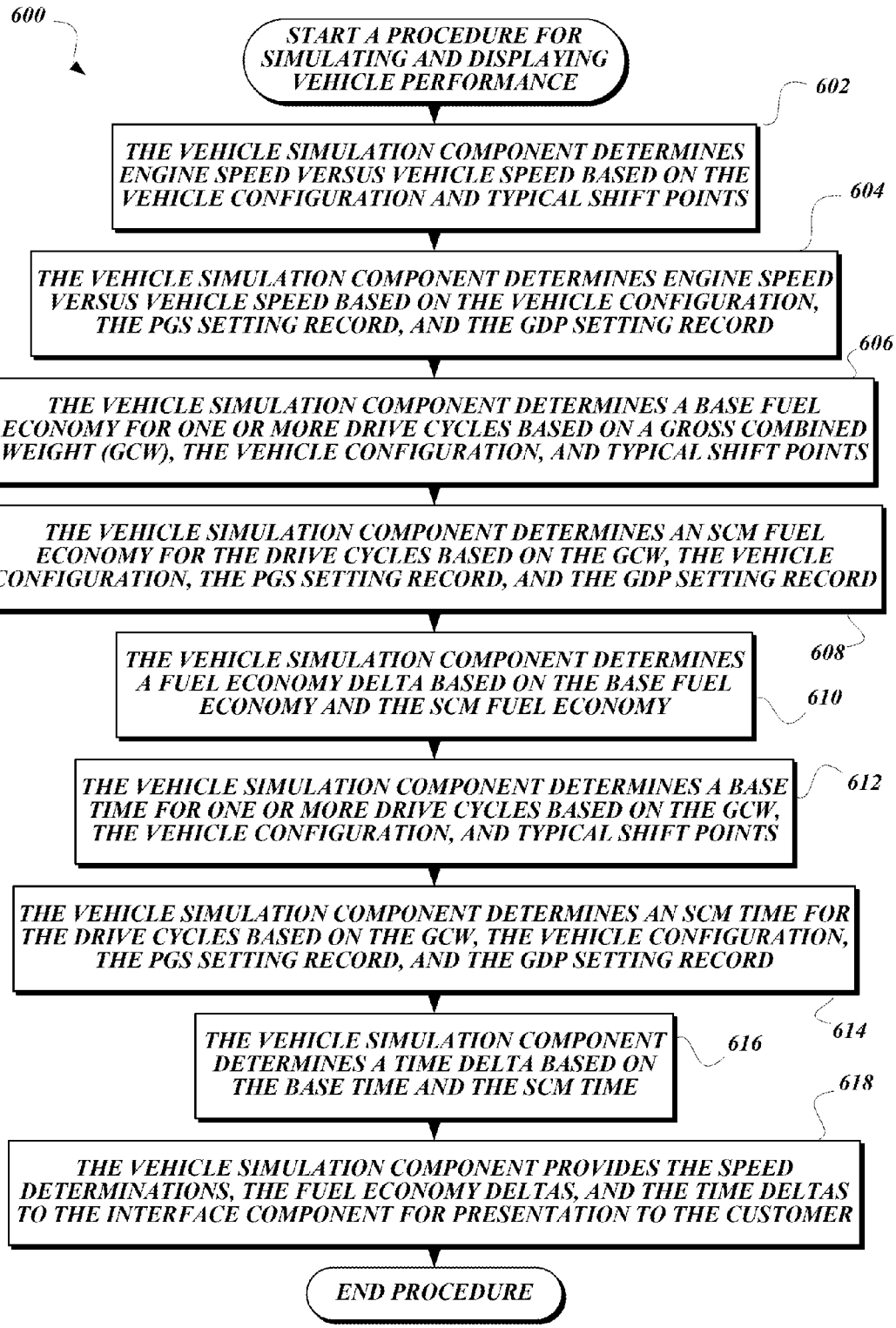
FIG. 6 illustrates one embodiment of a procedure for simulating and displaying vehicle performance according to various aspects of the present disclosure.

Returning now to FIG. 2, the method 200 then proceeds to block 212, where a procedure is performed wherein a vehicle simulation component 106 simulates vehicle drive cycle performance based on the settings, and the interface component 102 displays performance data to the customer 92. FIG. 6 illustrates one embodiment of a procedure 600 carried out in block 212 for simulating and displaying vehicle performance, according to various aspects of the present disclosure. From a start block, the procedure 600 proceeds to block 602, where the vehicle simulation component 106 determines engine speed versus vehicle speed based on the vehicle configuration and typical shift points specified by the customer 92. This determination is made assuming that neither progressive shift nor gear down protection setpoints are used. In some embodiments, the vehicle simulation component 106 calculates the engine speed versus vehicle speed based on transmission gear ratios, a rear axle ratio, a tire size, and/or other relevant configuration options within the vehicle configuration. At block 604, the vehicle simulation component 106 determines engine speed versus vehicle speed based on the vehicle configuration, the progressive shift setting record, and the gear down protection setting record. In some embodiments, the progressive shift settings and gear down protection settings may cause the shift points to occur at lower engine speeds and vehicle speeds, thus keeping the overall engine speed in a lower and more efficient range. A plot of the two shift point simulations is illustrated and described further below with respect to FIG. 7.

Next, at block 606, the vehicle simulation component 106 determines a base fuel economy for one or more drive cycles based on at least a gross combined weight (GCW), the vehicle configuration, and typical shift points. Various embodiments of methods for the generation and use of drive cycles for vehicle simulation are described in commonly owned, co-pending U.S. patent application Ser. No. 13/170,068, filed Jun. 27, 2011, the entire disclosure of which is hereby incorporated by reference herein in its entirety. The vehicle simulation component 106 may simulate the performance of the vehicle using an embodiment of a method described in the '068 application, or may use any other suitable vehicle simulation method. The result of the simulation will be a simulated overall fuel economy when operating the vehicle in a typical manner over the one or more drive cycles. In block 608, the vehicle simulation component 106 determines a speed control management fuel economy for the drive cycles based on the gross combined weight, the vehicle configuration, the progressive shift setting record, and the gear down protection setting record. As before, the vehicle simulation component 106 simulates the performance of the vehicle over the one or more drive cycles to determine a simulated overall fuel economy when operating the vehicle using the progressive shift settings and the gear down protection settings. The procedure 600 then proceeds to block 610, where the vehicle simulation component 106 determines a fuel economy delta based on the base fuel economy and the speed control management fuel economy. The fuel economy delta indicates how much fuel economy changes between the use of the typical shift points and the shift points determined by the progressive shift settings and the gear down protection settings. Typically, when properly configured, the fuel economy delta should show an increase in fuel economy using the speed control management setpoints.

The procedure 600 proceeds to block 612, where the vehicle simulation component 106 determines a base time for one or more drive cycles based on the gross combined weight, the vehicle configuration, and typical shift points. As with the fuel economy, the vehicle simulation component 106 may use any suitable method, such as those described in the '068 application, to generate the drive cycles and to simulate the performance of the vehicle over the drive cycles. The result of the simulation will be how long it would take the vehicle to traverse the drive cycle using typical shift points. At block 614, the vehicle simulation component 106 determines a speed control management time for the drive cycles based on the gross combined weight, the vehicle configuration, the progressive shift setting record, and the gear down protection setting record. The result of this simulation will be how long it would take the vehicle to traverse the drive cycle using the shift points specified by the progressive shift settings and the gear down protection settings. At block 616, the vehicle simulation component 106 determines a time delta based on the base time and the speed control management time. The time delta indicates how much the time to traverse the drive cycles changes between the use of typical shift points and the shift points determined by the progressive shift settings and the gear down protection settings. Typically, the time delta may indicate that it takes more time to traverse the drive cycles when using the speed control settings than when using the typical shift points, which indicates the cost involved in achieving higher fuel economy.

One of ordinary skill in the art will recognize that, in some embodiments, a simulated fuel economy and a simulated drive cycle time may be obtained in a single drive cycle simulation. Hence, the actions discussed above with respect to determining a base time for one or more drive cycles and determining a base fuel economy for one or more drive cycles may both occur during a single drive cycle simulation. Likewise, the actions discussed above with respect to determining a speed control management time for one or more drive cycles and determining a speed control management fuel economy for one or more drive cycles may both occur during a single drive cycle simulation. In other embodiments, only either fuel economy or time may be determined. One of ordinary skill in the art will recognize that various combinations of these features may be used together without departing from the scope of the present disclosure. For example, one of ordinary skill in the art will understand that such a display may also include many other types of simulated data, including, but not limited to, a percentage of time spent in top gear, a number of gear shifts per mile or per hour, and/or the like.

Figure 7:
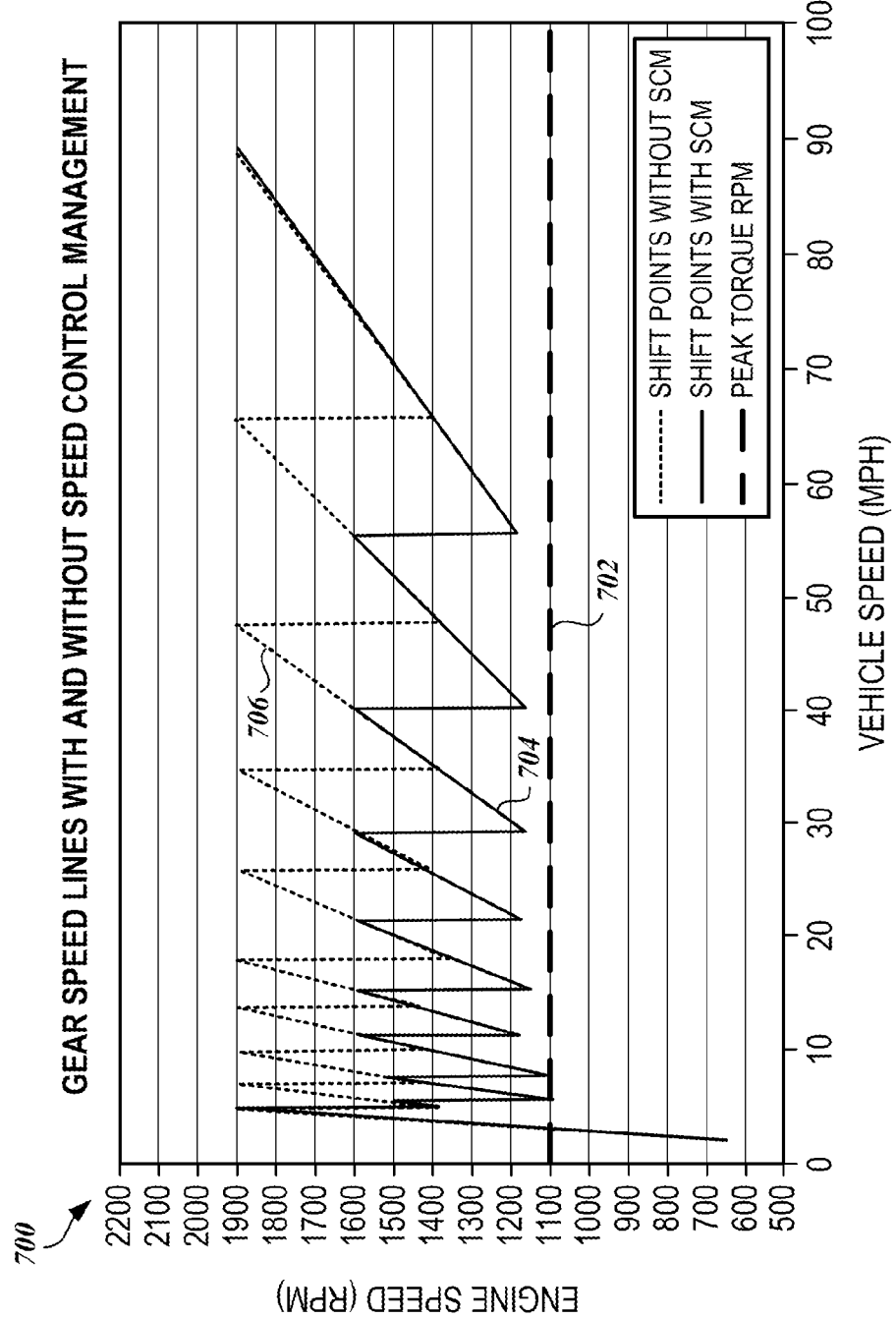
FIG. 7 illustrates one embodiment of a chart presented by an interface component to compare engine speed versus vehicle speed for typical shift points and speed control management settings according to various aspects of the present disclosure.

At block 618, the vehicle simulation component 106 provides the speed determinations, the fuel economy deltas, and the time deltas to the interface component 102 for presentation to the user. The procedure 600 then proceeds to an end block and terminates. One embodiment of a chart presented by the interface component 102 to show the speed determinations is illustrated in FIG. 7. The chart 700 includes vehicle speed values on an X-axis, and engine speed values on a Y-axis. Vehicle speed versus engine speed for typical shift points are illustrated using a dashed line 706, and vehicle speed versus engine speed for the speed control management shift points are illustrated using a solid line 704. As illustrated, a typical operator may upshift around 1900 RPM. Meanwhile, the speed control management setpoints do not restrict the operator in a first gear, but a first progressive shift setpoint limits the operator to about 1500 RPM in a second gear, and a second progressive shift setpoint limits the operator to about 1600 RPM in third gear through eighth gear. As shown in the graph 700, this results in shifting occurring at lower vehicle speeds, and also results in much lower engine speeds while keeping engine speeds after upshifts above a peak torque speed threshold 702.

Figure 8:
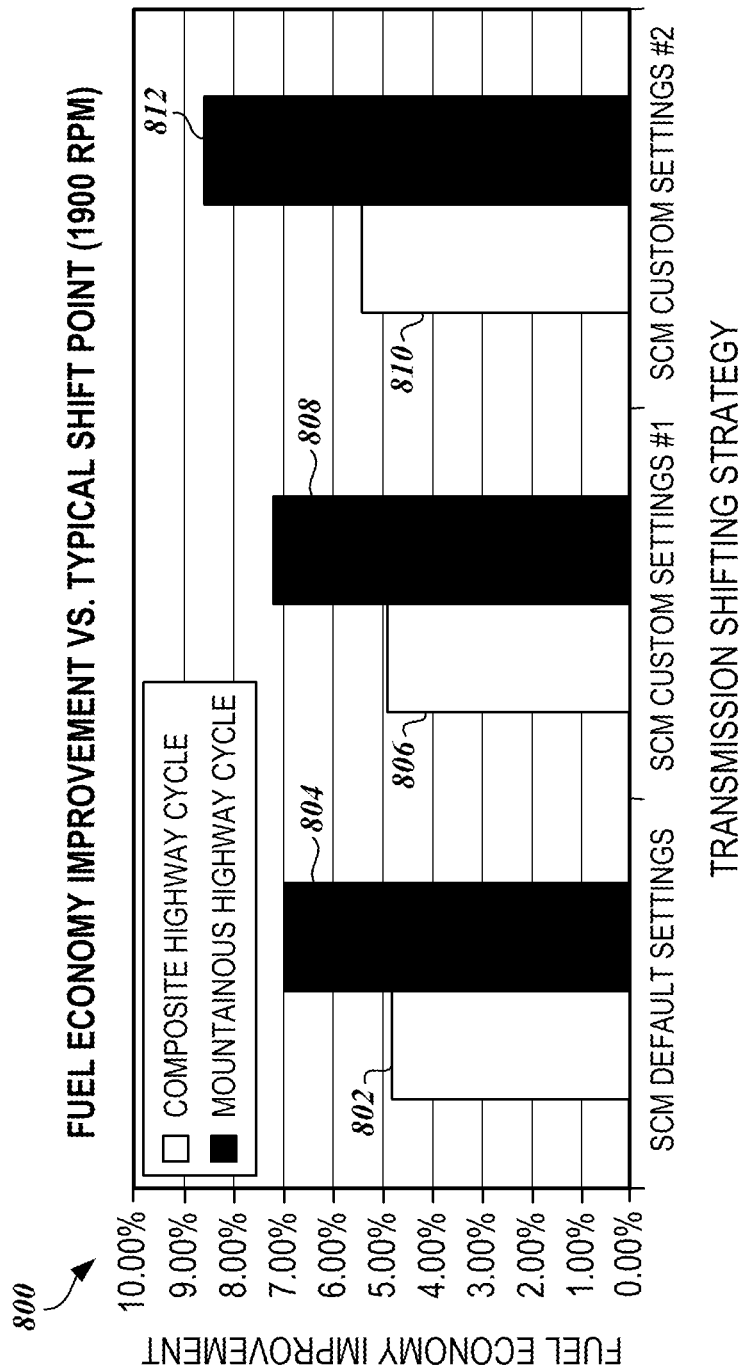
FIG. 8 illustrates one embodiment of a chart presented by the interface component to compare fuel economy improvements using various speed control management settings according to various aspects of the present disclosure.

One embodiment of a chart presented by the interface component 102 to show fuel economy deltas is illustrated in FIG. 8. The Y-axis on the bar chart 800 includes fuel economy improvement as a percentage when compared to the typical fuel economy. As illustrated, the chart 800 illustrates a fuel economy delta for a composite highway drive cycle 802, and for a mountainous highway drive cycle 804 using the speed control management settings. The chart 800 may also illustrate fuel economy deltas for composite highway drive cycles 806, 810 and for mountainous highway drive cycles 808, 812 using additional speed control management setting options. These additional speed control management setting options may be options selected by the customer after being presented with an interface for customizing the calculated values, as discussed further below with respect to FIGS. 10 and 11.

Figure 9:
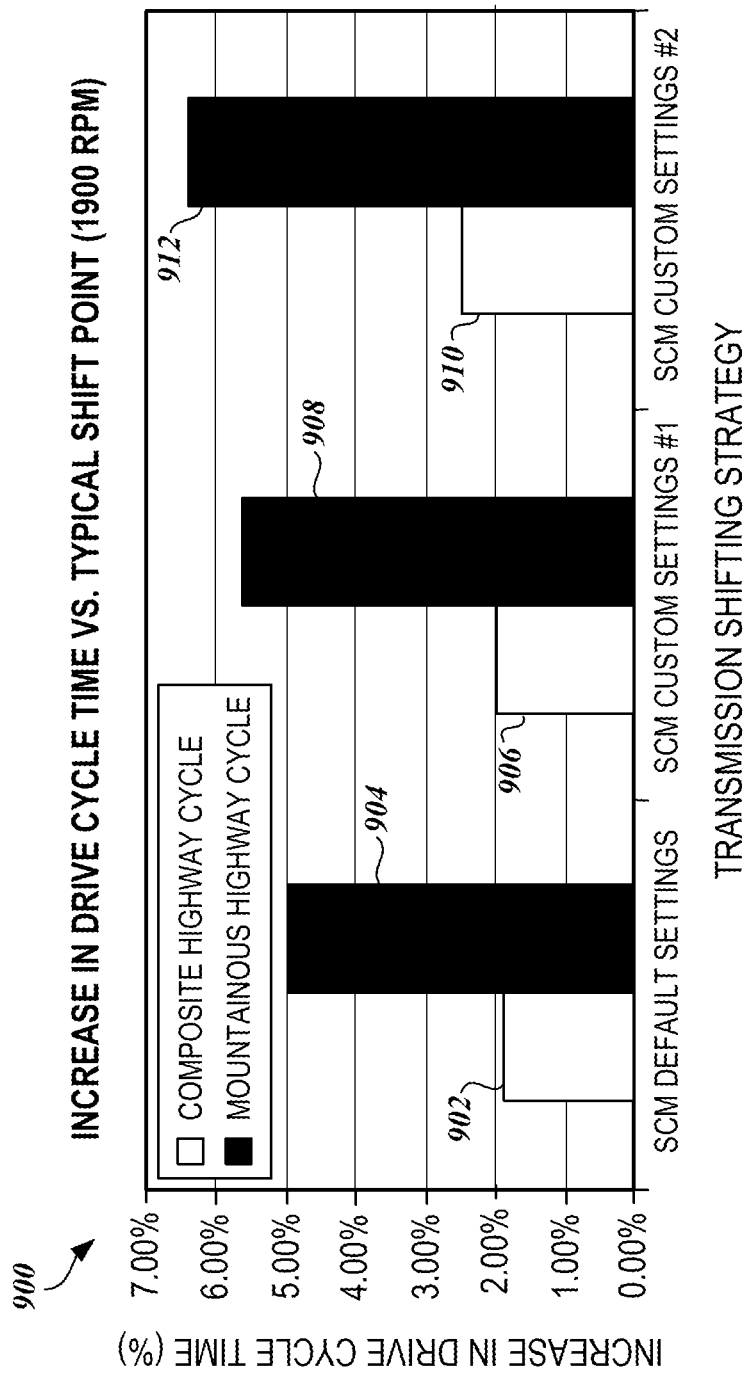
FIG. 9 illustrates one embodiment of a chart presented by the interface component to compare drive time differences using various speed control management settings according to various aspects of the present disclosure.

One embodiment of a chart presented by the interface component 102 to show drive cycle time deltas is illustrated in FIG. 9. The Y-axis on the bar chart 900 includes an increase in time as a percentage when compared to the typical time to complete the drive cycle. As illustrated, the chart 900 illustrates a time delta for a composite highway drive cycle 902, and for a mountainous highway drive cycle 904 using the speed control management settings. The chart 900 may also illustrate time deltas for composite highway drive cycles 906, 910 and for mountainous highway drive cycles 908, 912 using additional speed control management setting options. As stated above, these additional speed control management setting options may be options selected by the customer after being presented with an interface for customizing the calculated values, as discussed further below with respect to FIGS. 10 and 11.

Returning now to FIG. 2, at block 214, the setting calculation component 104 determines valid progressive shift and gear down protection setting ranges, and receives a selection of progressive shift and gear down protection settings from the interface component 102. The setting calculation component 104 may determine valid progressive shift and gear down protection setting ranges based on the vehicle configuration, including the optimization goal. Valid settings may be determined similarly to the validation of transmission configuration in the co-pending '638 application. For example, the valid progressive shift and gear down protection setting ranges may be determined by calculating which settings (or combinations of settings) can provide adequate startability and gradeability performance for the vehicle while still meeting the optimization goal. The valid setting ranges may also exclude any settings (or combinations of settings) that would result in unusable gears.

In some embodiments, the setting calculation component 104 provides the settings from the progressive shift setting record and the gear down protection setting record along with the determined valid setting ranges to the interface component 102 for presentation to and selection by the customer. FIG. 10 illustrates an exemplary interface dialog 1000 for displaying progressive shift setting ranges and accepting a selection from a customer, according to various aspects of the present disclosure. As illustrated, the interface dialog 1000 includes an activation gear interface field 1002, a first progressive shift limit interface field 1004, a gear selection interface field 1008 for the first progressive shift limit, a second progressive shift limit interface field 1010, and a gear selection interface field 1014 for the second progressive shift limit.

In some embodiments, the first progressive shift limit interface field 1004 and the second progressive shift limit interface field 1008 may initially display the default limits from the progressive shift setting record, and may then allow the customer 92 to specify different limits. In some embodiments, the first progressive shift limit interface field 1004 and the second progressive shift limit interface field 1008 may include drop-down lists of valid speed limit choices at predetermined intervals within a range calculated by the setting calculation component 104. In some embodiments, the interface fields may be freely editable, but the interface dialog 1000 may include a first progressive shift limit prompt 1006 and a second progressive shift limit prompt 1012 to indicate to the customer 92 what valid speed limit ranges were calculated by the setting calculation component 104.

The activation gear interface field 1002 allows the customer to choose the lowest gear for which progressive shift will be active, and for which each gear lower than the selected gear will be stored as progressive shift inactive gears. The illustrated value of "2" corresponds to the previously described default of the first gear being set as a progressive shift inactive gear. The drop-down portion of the activation gear interface field 1002 may display other valid values, as determined by the setting calculation component 104. For example, in the case of a transmission having eighteen gears, the drop-down portion of the activation gear interface field 1002 may display values of "2" and "3."

The gear selection interface field 1008 for the first progressive shift limit allows the customer to choose the highest gear for which the first progressive shift limit will be applied, and the gear selection interface field 1014 for the second progressive shift limit allows the customer to choose the highest gear for which the second progressive shift limit will be applied. These settings assume that the second progressive shift limit will be applied starting at the first gear higher than the highest gear for which the first progressive shift limit will be applied. Hence, the drop-down portion of the gear selection interface field 1008 for the first progressive shift limit may show gears starting at the first gear for which progressive shift is active, and continuing up to a highest gear which allows for at least one available gear for the second progressive shift limit. Likewise, the drop-down portion of the gear selection interface field 1014 for the second progressive shift limit may show gears starting at the first gear higher than the gear selected in the gear selection interface field 1008 for the first progressive shift limit, and continuing up to a highest gear available for progressive shift, as discussed above with respect to FIGS. 4A and 4B.

In some embodiments, the gears displayed in the drop-down portions of the interface fields or the default engine speed limits may change dynamically based on the selections made in the other interface fields. Also, in some embodiments, the setting calculation component 104 determines whether any gear selections or combinations thereof would be unusable or would result in unsatisfactory vehicle performance, and ensures that those gears are not displayed in the interface fields.

Once the customer 92 has reviewed the options and made changes to the values, if any changes are desired, the customer 92 may submit the interface dialog 1000 by actuating a save interface button 1016. Once this button is actuated, the setting calculation component 104 ensures that each of the selections is valid, and will result in a vehicle having adequate performance. If the settings are determined to be invalid, an error message may be displayed, prompting the customer 92 to address any errors.

FIG. 11 illustrates an exemplary interface dialog 1100 for displaying gear down protection setting ranges and accepting a selection from a customer, according to various aspects of the present disclosure. As illustrated, the interface dialog 1100 includes a first activation gear interface field 1102, a gear down protection limit interface field 1104, a last activation gear interface field 1108, and a save interface button 1112. In some embodiments, the values initially displayed in the interface fields may be the values stored in the gear down protection setting record. As with the interface dialog 1000 for displaying progressive shift setting ranges, the setting calculation component 104 calculates valid ranges for each of the values. A drop-down list associated with the first activation gear interface field 1102 displays each of the valid gears for starting to activate gear down protection, and a drop-down list associated with the last activation gear interface field 1108 displays each of the valid gears for stopping to activate gear down protection. In some embodiments in which only one gear lower than the top gear is considered valid for activating gear down protection, the first activation gear interface field 1102 and the last activation gear interface field 1108 may have the same value, and may not be further configurable. In some embodiments, more than one gear may be displayed in the drop-down lists. The illustrated gear down protection limit interface field 1104 does not include a drop-down list, but instead the calculated range of valid gear down protection limit values is displayed as a prompt 1106 to inform the customer 92 of the valid values. In some embodiments, the gear down protection limit interface field 1104 may include a drop-down list including values within the valid range at predetermined intervals for selection by the customer 92. Upon selecting the save interface button 1112 to submit the selections by the customer 92, the setting calculation component 104 may verify that the configured settings result in acceptable vehicle performance and that no unusable gears exist. If errors are detected, an error message may be displayed to the customer 92 along with instructions for correcting the error.

In some embodiments, the setting calculation component 104 may check for settings that are invalid due to reasons other than vehicle performance, startability, gradeability, or optimization goals. For example, the setting calculation component 104 may check for settings that are unable to be fulfilled by the order fulfillment pipeline. If the order fulfillment pipeline includes an end-of-line dynamometer test, the setting calculation component 104 may indicate an error and request changes to the settings if it is determined that the settings are outside of a testing capability of the end-of-line dynamometer test.

Returning now to FIG. 2, the method 200 proceeds to a decision block 216, where a determination is made as to whether the customer made any changes to the previously analyzed settings. If the customer had made changes to the previously analyzed settings, the result of the determination at decision block 216 is YES, and the method 200 returns to block 212, where the procedure described therein is performed with respect to the changed settings specified by the customer. If the customer did not make any changes to the previously analyzed settings and instead selected the settings as previously analyzed, the result of the determination at decision block 216 is NO, and the method 200 proceeds to block 218, where an order processing component 110 includes the progressive shift and gear down protection settings with an order stored in the order data store 112. The order may later be used during an order fulfillment process, and the vehicle will be configured with the selected progressive shift and gear down protection settings while being prepared for delivery to the customer. The method 200 then proceeds to an end block and terminates.

While illustrative embodiments have been illustrated and described, it will be appreciated that various changes can be made therein without departing from the spirit and scope of the claimed subject matter. Although the method and various embodiments thereof have been described as performing sequential steps, the claimed subject matter is not intended to be so limited. As nonlimiting examples, the described steps need not be sequential and/or not all steps are required to perform the method. As such, one of ordinary skill will appreciate that such examples are within the scope of the claimed embodiments.

The invention claimed is:

1. A nontransitory computer-readable medium having computer-executable instructions stored thereon that, if executed by one or more processors of a computing device, cause the computing device to perform actions for configuring a vehicle, the actions comprising:
    receiving, by the computing device, a vehicle configuration;
    determining, by the computing device, a progressive shift limit and a gear down protection limit associated with the vehicle;
    determining, by the computing device, whether the progressive shift limit and the gear down protection limit result in any dead gears based on the vehicle configuration; and
    in response to determining that the limits result in any dead gears:
        modifying the progressive shift limit or the gear down protection limit to eliminate any dead gears; and
        storing, by the computing device in an order data store, the modified progressive shift limit or the modified gear down protection limit;
    wherein determining whether the progressive shift limit and the gear down protection limit result in any dead gears based on the vehicle configuration includes:
        determining a vehicle speed in a highest gear for which progressive shift is active based on the progressive shift limit and the vehicle configuration;
        determining an engine speed in a lowest gear for which gear down protection is active based on the determined vehicle speed and the vehicle configuration; and
        indicating that the limits result in a dead gear in response to determining that the engine speed is below a peak torque range for an engine model specified in the vehicle configuration.

2. The computer-readable medium of claim 1, wherein determining the progressive shift limit and the gear down protection limit associated with the vehicle includes receiving a selected progressive shift limit and selected gear down protection limit from a customer.

3. The computer-readable medium of claim 2, wherein modifying the progressive shift limit or the gear down protection limit to eliminate any dead gears includes prompting the customer to provide a new progressive shift limit or a new gear down protection limit.

4. The computer-readable medium of claim 3, wherein prompting the customer to provide the new progressive shift limit or the new gear down protection limit includes presenting to the customer a range of valid progressive shift limits or gear down protection limits.

5. A computer-implemented method of configuring a vehicle, the method comprising:
    receiving, by a computing device, a vehicle configuration;
    determining, by the computing device, a progressive shift limit and a gear down protection limit associated with the vehicle;
    determining, by the computing device, whether the progressive shift limit and the gear down protection limit result in any dead gears based on the vehicle configuration; and
    in response to determining that the limits result in any dead gears:
        modifying the progressive shift limit or the gear down protection limit to eliminate any dead gears; and
        storing, by the computing device in an order data store, the modified progressive shift limit or the modified gear down protection limit;
    wherein determining whether the progressive shift limit and the gear down protection limit result in any dead gears based on the vehicle configuration includes:
        determining a vehicle speed in a highest gear for which progressive shift is active based on the progressive shift limit and the vehicle configuration;
        determining an engine speed in a lowest gear for which gear down protection is active based on the determined vehicle speed and the vehicle configuration; and
        indicating that the limits result in a dead gear in response to determining that the engine speed is below a peak torque range for an engine model specified in the vehicle configuration.

6. The method of claim 5, wherein determining the progressive shift limit and the gear down protection limit associated with the vehicle includes receiving a selected progressive shift limit and a selected gear down protection limit from a customer.

7. The method of claim 6, wherein modifying the progressive shift limit or the gear down protection limit to eliminate any dead gears includes prompting the customer to provide a new progressive shift limit or a new gear down protection limit.

8. The method of claim 7, wherein prompting the customer to provide the new progressive shift limit or the new gear down protection limit includes presenting to the customer a range of valid progressive shift limits or gear down protection limits.

9. A computing device, comprising:
at least one processor;
a memory; and
a computer-readable medium having computer-executable instructions stored thereon that, in response to execution by the at least one processor, cause the computing device to perform actions for configuring a vehicle, the actions comprising:
receiving, by the computing device, a vehicle configuration;
determining, by the computing device, a progressive shift limit and a gear down protection limit associated with the vehicle;
determining, by the computing device, whether the progressive shift limit and the gear down protection limit result in any dead gears based on the vehicle configuration; and
in response to determining that the limits result in any dead gears:
modifying the progressive shift limit or the gear down protection limit to eliminate any dead gears; and
storing, by the computing device in an order data store, the modified progressive shift limit or the modified gear down protection limit;
wherein determining whether the progressive shift limit and the gear down protection limit result in any dead gears based on the vehicle configuration includes:
determining a vehicle speed in a highest gear for which progressive shift is active based on the progressive shift limit and the vehicle configuration;
determining an engine speed in a lowest gear for which gear down protection is active based on the determined vehicle speed and the vehicle configuration; and
indicating that the limits result in a dead gear in response to determining that the engine speed is below a peak torque range for an engine model specified in the vehicle configuration.

10. The computing device of claim 9, wherein determining the progressive shift limit and the gear down protection limit associated with the vehicle includes receiving a selected progressive shift limit and a selected gear down protection limit from a customer.

11. The computing device of claim 10, wherein modifying the progressive shift limit or the gear down protection limit to eliminate any dead gears includes prompting the customer to provide a new progressive shift limit or a new gear down protection limit.

12. The computing device of claim 11, wherein prompting the customer to provide the new progressive shift limit or the new gear down protection limit includes presenting to the customer a range of valid progressive shift limits or gear down protection limits.

* * * * *